United States Patent
Yan

(10) Patent No.: US 9,967,489 B2
(45) Date of Patent: May 8, 2018

(54) IMAGE PIXELS WITH IN-COLUMN COMPARATORS

(71) Applicant: SEMICONDUCTOR COMPONENTS INDUSTRIES, LLC, Phoenix, AZ (US)

(72) Inventor: Hai Yan, San Ramon, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days. days.

(21) Appl. No.: 15/287,568

(22) Filed: Oct. 6, 2016

(65) Prior Publication Data

US 2018/0103222 A1    Apr. 12, 2018

(51) Int. Cl.
*H04N 5/369* (2011.01)
*H01L 27/146* (2006.01)
*H04N 5/374* (2011.01)
*H04N 5/378* (2011.01)

(52) U.S. Cl.
CPC ..... *H04N 5/3698* (2013.01); *H01L 27/14614* (2013.01); *H01L 27/14638* (2013.01); *H01L 27/14643* (2013.01); *H04N 5/378* (2013.01); *H04N 5/3742* (2013.01)

(58) Field of Classification Search
CPC .... H04N 5/3698; H04N 5/3742; H04N 5/378; H01L 27/14614; H01L 27/14643; H01L 27/14638
USPC ......................................................... 348/301
See application file for complete search history.

(56) References Cited

U.S. PATENT DOCUMENTS

| 2010/0002120 A1* | 1/2010 | Yoshikawa .......... H04N 5/3575 348/312 |
| 2014/0291482 A1* | 10/2014 | Tanaka ................... H04N 5/378 250/208.1 |
| 2016/0006969 A1* | 1/2016 | Matsumoto ....... H01L 27/14614 348/308 |

(Continued)

OTHER PUBLICATIONS

Ho et al., "CMOS 3-T Digital Pixel Sensor with In-Pixel Shared Comparator"; IEEE International Symposium on Circuits and Systems, 2012, pp. 930-933.

*Primary Examiner* — Nhan T Tran
(74) *Attorney, Agent, or Firm* — Treyz Law Group, P.C.; Joseph F. Guihan

(57) ABSTRACT

Image sensors may include imaging pixels that have comparators to read out image pixel signals. An imaging pixel may include a photodiode, a floating diffusion region, and a transfer transistor that transfers charge from the photodiode to the floating diffusion region. The floating diffusion region may be coupled to a source follower transistor. The source follower transistor may be coupled to a current source. A row select transistor may be interposed between the source follower transistor and the current source. To form an in-column comparator stage and reduce power consumption, an additional transistor may be interposed between the row select transistor and the current source. The additional transistor may be a pMOS transistor and the source follower transistor may be an nMOS transistor. The additional transistor may have a gate that receives a searching voltage that is ramped from a maximum value to a minimum value.

19 Claims, 10 Drawing Sheets

(56) References Cited

U.S. PATENT DOCUMENTS

2016/0028974 A1* 1/2016 Guidash ................. H04N 5/378
                                                    348/294
2017/0085820 A1* 3/2017 Inada ..................... H04N 5/374

* cited by examiner

IMAGE PIXELS WITH IN-COLUMN COMPARATORS

BACKGROUND

This relates generally to imaging devices, and more particularly, to imaging devices having comparators.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

The circuitry used for reading out image signals from the image pixels may include a comparator. The comparator may compare signals from the pixel to reference signals to determine the value of the signals from the pixel. Conventional comparators may use multiple stages that each consume power. The comparators may therefore undesirably increase power consumption in the image sensor.

It would therefore be desirable to be able to provide improved arrangements for comparators in image sensors.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
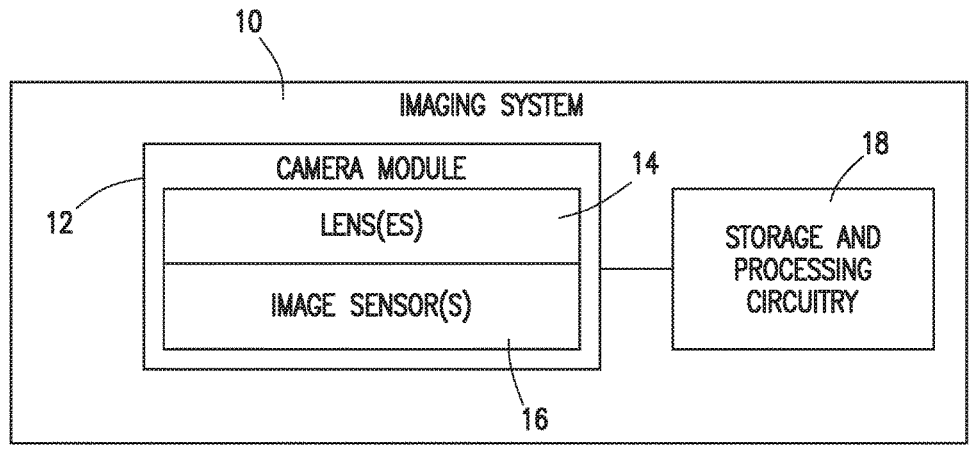
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18. Image sensor 16 and processing circuitry 18 may be implemented using a stacked-chip arrangement if desired.

Figure 2:
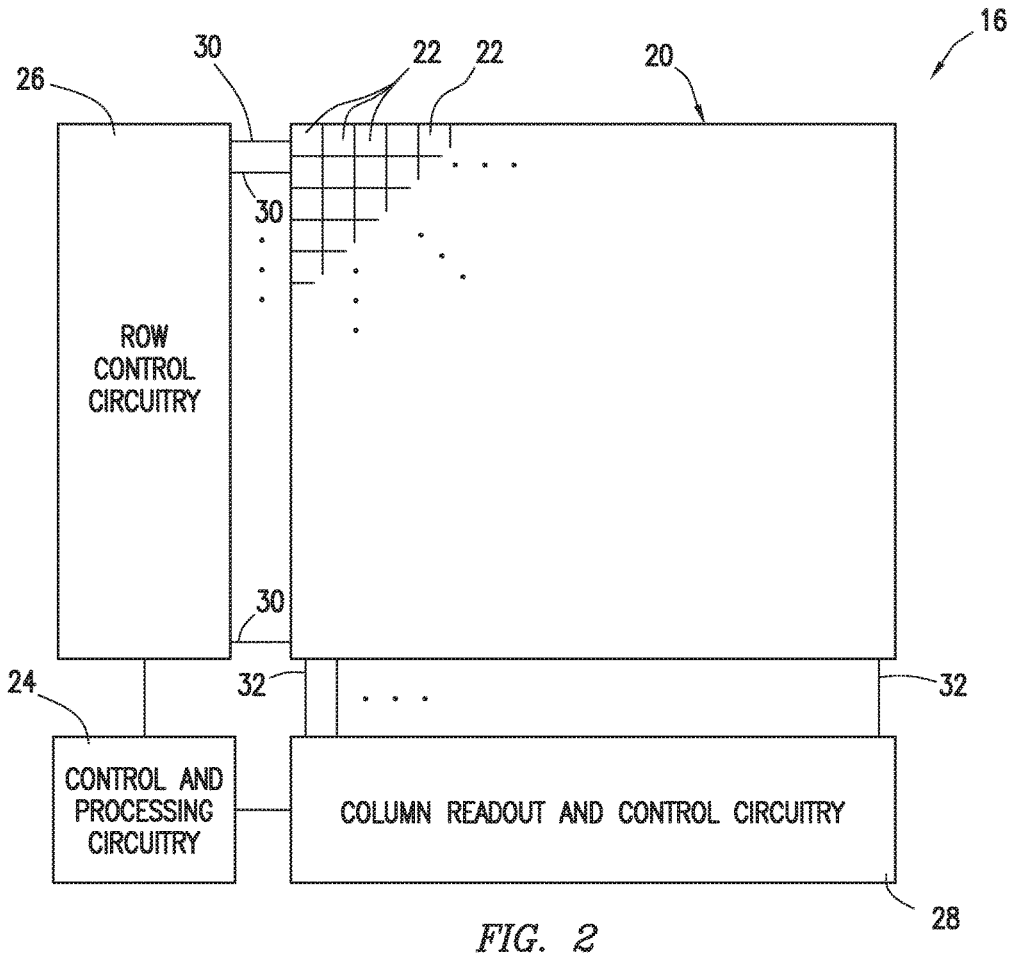
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Figure 3:
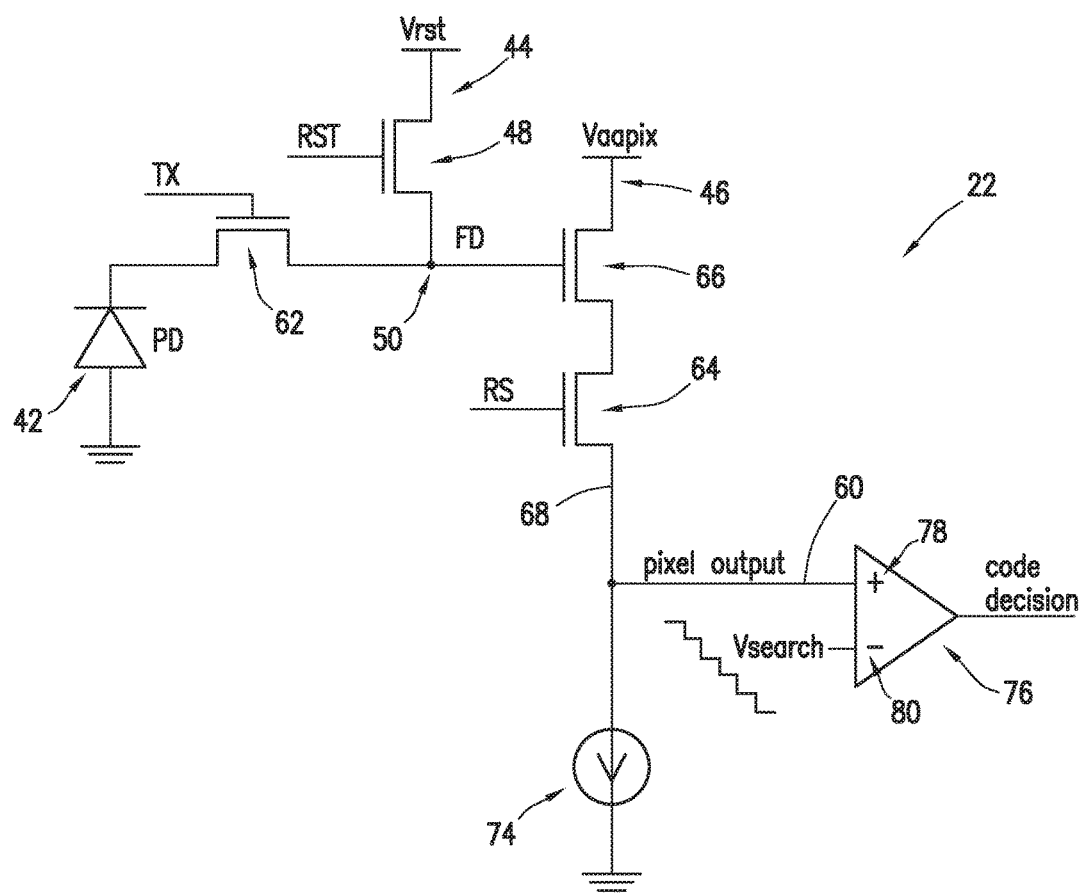
FIG. 3 is a circuit diagram of an illustrative image sensor pixel with a comparator in accordance with an embodiment.
Figure 4:
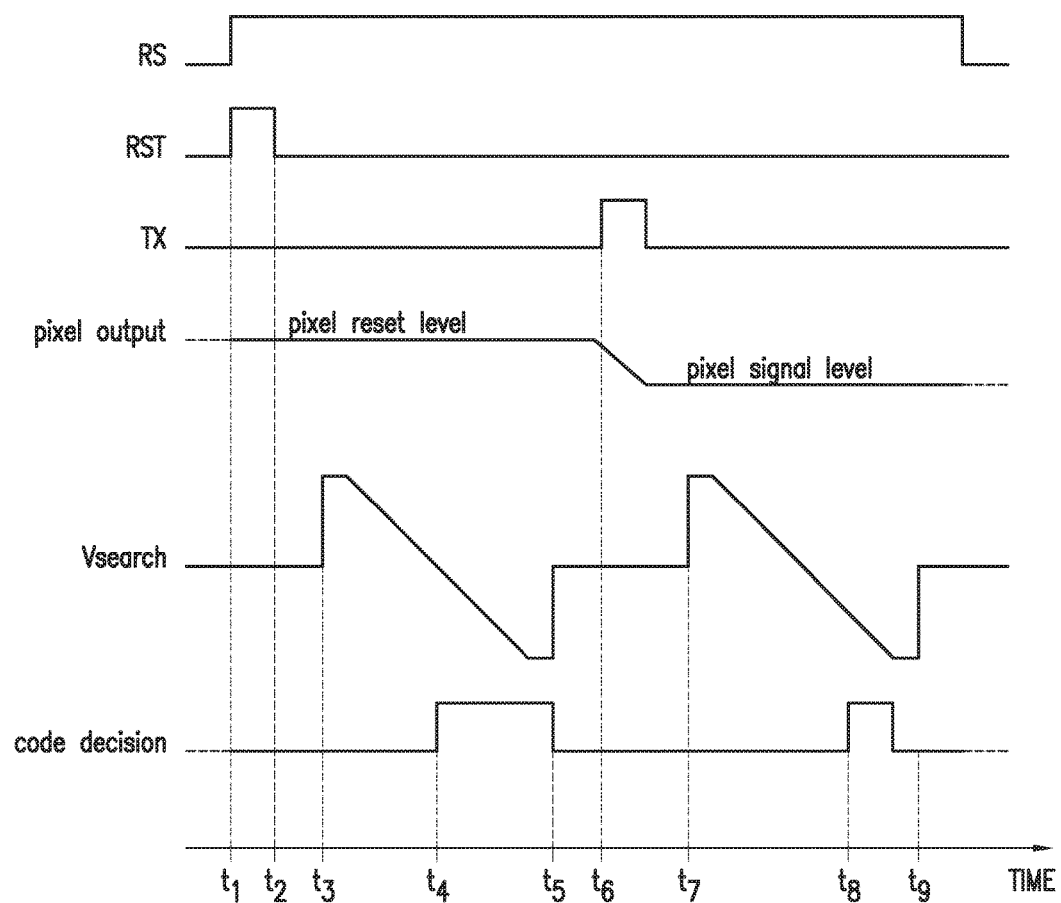
FIG. 4 is a timing diagram for operating an illustrative image sensor pixel such as the pixel in FIG. 3 in accordance with an embodiment.

Circuitry of an illustrative image pixel 22 of image sensor 16 is shown in FIG. 3. A timing diagram demonstrating the operation of pixel 22 is shown in FIG. 4. As shown in FIG. 3, pixel 22 may include a photosensitive element such as photodiode 42 (PD). A bias voltage may be supplied to positive power supply lines 44 and 46. For example, $V_{rst}$ may be supplied to positive power supply line 44 and $V_{aapix}$ may be supplied to positive power supply line 46. If desired, the same bias voltage may supplied to both power supply lines 44 and 46 (i.e., lines 44 and 46 may be shorted together and $V_{rst}$ may be the same as $V_{aapix}$). Alternatively, different bias voltages may be supplied to positive power supply lines 44 and 46. Incoming light is collected by photodiode 42 after passing through a color filter structure. Photodiode 42 converts the light to electrical charge.

Before an image is acquired, row select signal RS may be asserted at $t_1$. When signal RS is asserted, transistor 64 turns on and a corresponding output signal (pixel output) that is representative of the magnitude of the charge on charge storage node 50 is produced on output path 60. The signal associated with the stored charge on node 50 is conveyed to row select transistor 64 by source-follower transistor 66. Source-follower transistor 66 may be an n-channel metal-oxide-semiconductor field-effect (nMOS) transistor. In a typical configuration, there are numerous rows and columns of pixels such as pixel 22 in the image sensor pixel array of a given image sensor. A vertical conductive path such as path 68 may be associated with each column of pixels. Path 68 may be coupled to current source 74.

When signal RS is asserted in a given row, path 68 can be used to route an output signal (pixel output) from that row to comparator 76. Reset control signal RST may also be asserted at $t_1$, as shown in FIG. 4. Asserting the reset control signal may turn on reset transistor 48 and resets charge storage node 50 (also referred to as floating diffusion FD) to $V_{rst}$. The reset control signal RST may then be deasserted at time $t_2$ to turn off reset transistor 48. After the reset process is complete, the charge level at floating diffusion node 50 (sometimes referred to as floating diffusion region 50) may be sampled.

Comparator 76 may be used to determine the pixel reset level. Comparator may have a first input terminal 78 that receives the pixel output signal from path 60. The second input terminal 80 may receive a searching voltage $V_{search}$. To determine the level of charge of the pixel output signal, the searching voltage may be varied in a known way. For example, the searching voltage may be reduced step-by-step as shown in FIG. 3. The comparator may output a code decision indicating whether the pixel output signal is as high as the searching voltage. When the pixel output signal is less than the searching voltage, the comparator's code decision may be at a logic low level "0". At some point, the searching voltage will drop below the pixel reset level. When the pixel output signal is greater than the searching voltage, the comparator's code decision may be at a logic high level "1". Using this technique, the pixel reset level can therefore be determined. For example, if the code decision changes from low to high when the searching voltage changes from a first voltage to a second voltage, the pixel output signal may be between the first and second voltages.

The searching voltage may be varied using any desired algorithm. The searching voltage can be a step-by-step algorithm, a successive approximation algorithm, or any other desired algorithm. Because the comparator helps convert the analog pixel reset level to a digital representation of the pixel reset level, comparator 76 may sometimes be referred to as an analog to digital converter. Comparator 76 may also be said to form a readout circuit or readout circuitry. If desired, comparator 76 may be used in combination with other readout circuitry. For example, storage capacitors, amplifiers, or additional components may be used with comparator 76.

FIG. 4 shows details of the sampling of the pixel reset level. As shown in FIG. 4, after the floating diffusion node is reset between $t_1$ and $t_2$, the searching voltage step-by-step algorithm begins at $t_3$. The searching voltage may have a maximum value at approximately $t_3$. The searching voltage may then be successively lowered to a minimum value between $t_3$ and $t_5$. Between $t_3$ and $t_4$, the code decision from the comparator may be low. At $t_4$, however, the searching voltage may drop below the pixel reset level and the code decision may become high. The searching voltage at $t_4$ may therefore be an approximation of the pixel reset level.

Next, after the reset charge level has been sampled, transfer gate control signal TX may be asserted at $t_6$ to turn on transfer transistor (transfer gate) 62. When transfer transistor 62 is turned on, the charge that has been generated by photodiode 42 in response to incoming light is transferred to charge storage node 50. Transfer gate control signal TX may be deasserted after the transfer in charge is complete. As shown in FIG. 4, the pixel output signal may drop from the pixel reset level to the pixel signal level after the transfer transistor is asserted at $t_6$.

Once the charge has been transferred from photodiode 42 to floating diffusion node 50, the charge level at floating diffusion node 50 may be sampled using comparator 76.

The sampling process for the pixel signal level may be similar to the sampling process for the pixel reset level, with the searching voltage being varied according to a known pattern to determine the pixel signal level. As shown in FIG. 4, the searching voltage may drop from a maximum value at $t_7$ to a minimum value at $t_9$. Between $t_7$ and $t_8$, the code decision from the comparator may be low. At $t_8$, however, the searching voltage may drop below the pixel reset level and the code decision may become high. The searching voltage at $t_8$ may therefore be an approximation of the pixel reset level.

Charge storage node 50 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 42.

If desired, other types of image pixel circuitry may be used to implement the image pixels of sensor 16. For example, image pixels in image sensor 14 may be three-transistor pixels, pin-photodiode pixels with four transistors each, global shutter pixels, time-of-flight pixels, etc. Additionally, the pixel shown in FIG. 4 may be implemented in a stacked-chip arrangement if desired. The pixel may be split between chips at any desired point within the pixel (e.g., between the transfer transistor and the floating diffusion region, between the source follower transistor and the row select transistor, etc.).

In some cases, comparator 76 may include multiple stages to ensure high gain and high speed (e.g., comparator 76 may be a multi-stage comparator). However, each stage of comparator 76 may require a power supply, increasing the total power consumption of the sensor. To reduce the power consumption of the sensor, comparator 76 may use current source 74 for an in-column comparator stage.

Figure 5:
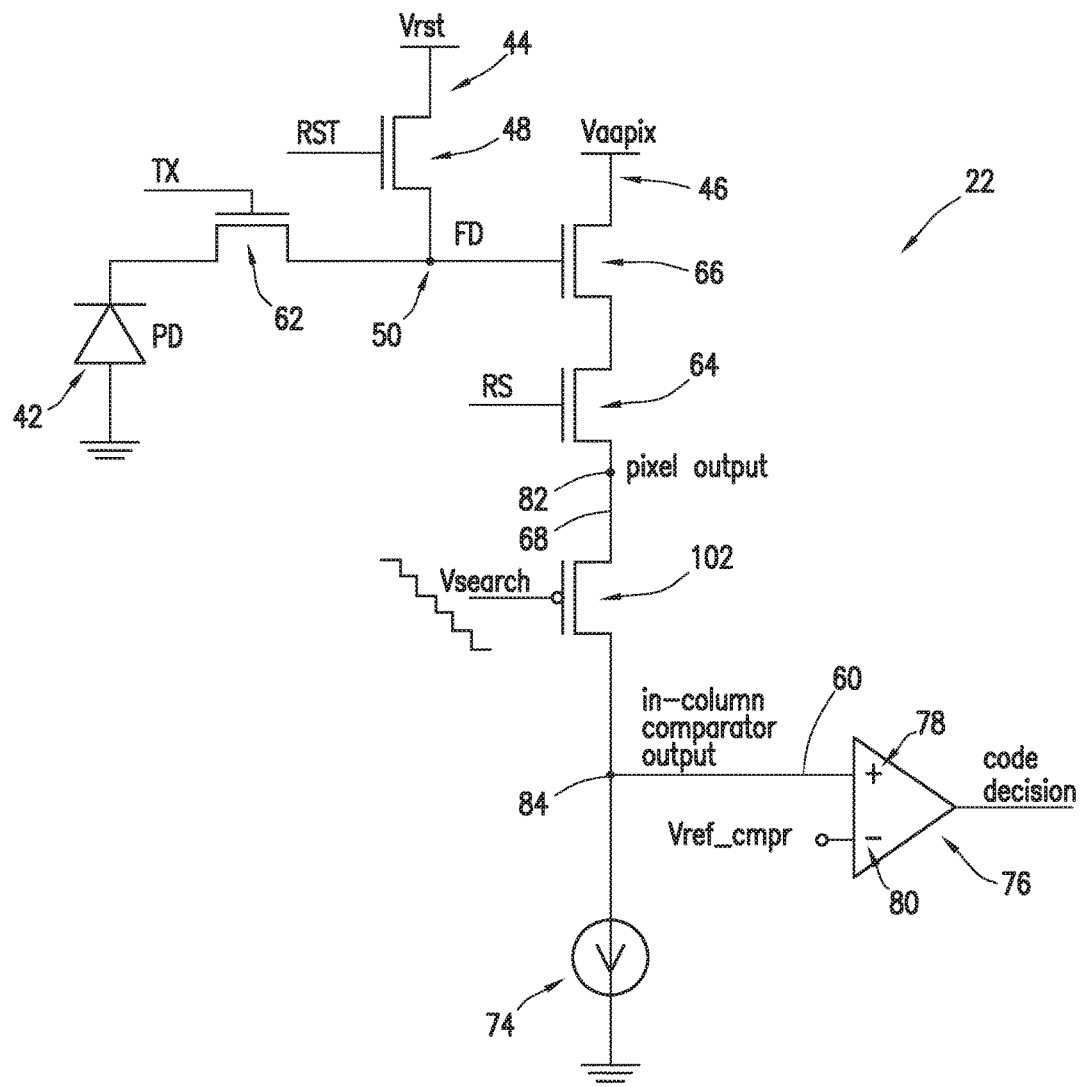
FIG. 5 is a circuit diagram of an illustrative image sensor pixel with an in-column comparator in accordance with an embodiment.
Figure 6:
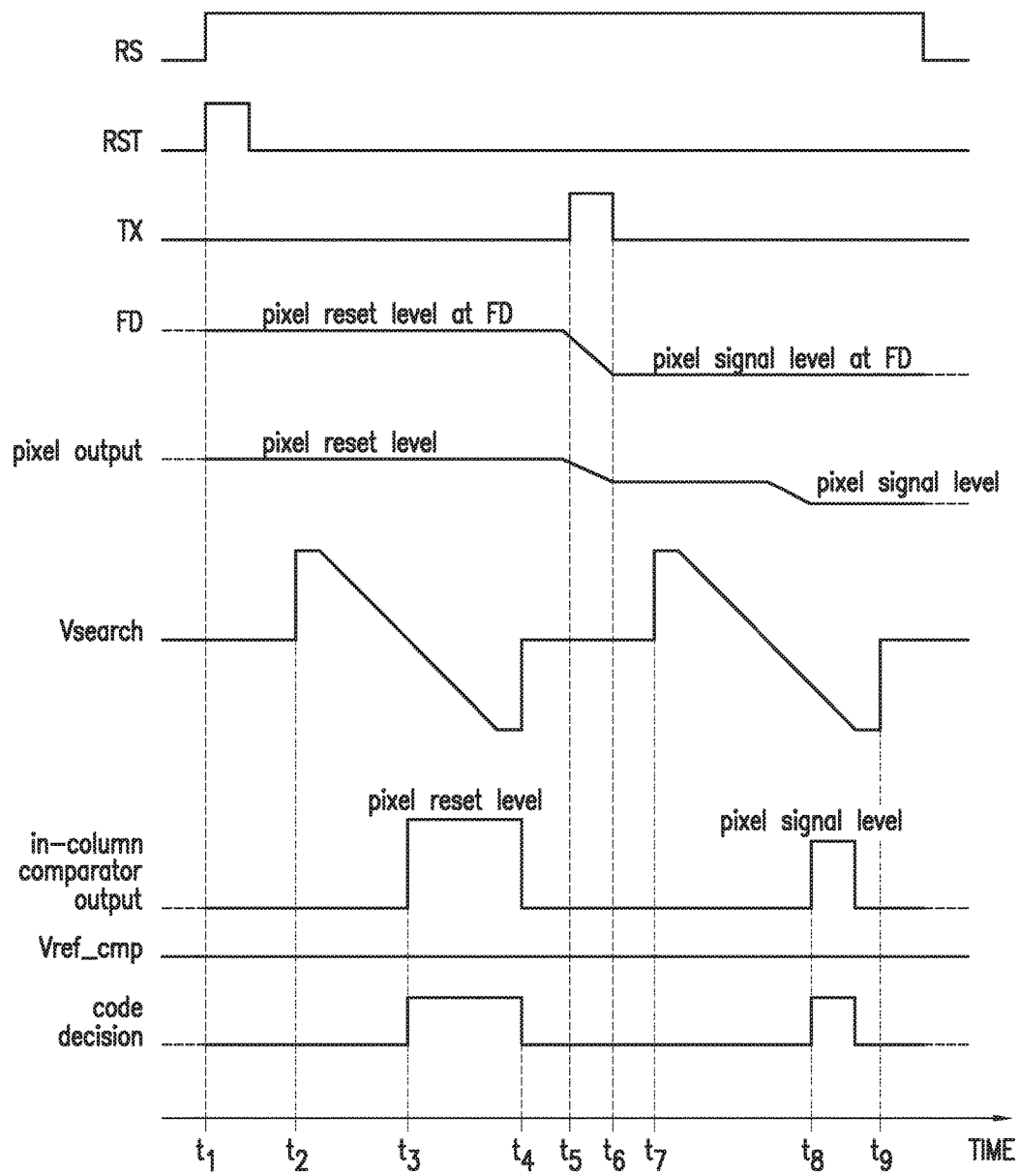
FIG. 6 is a timing diagram for operating an illustrative image sensor pixel such as the pixel in FIG. 5 in accordance with an embodiment.

FIG. 5 shows an illustrative imaging pixel 22 of image sensor 16 that includes an in-column comparator stage. A timing diagram demonstrating the operation of pixel 22 is shown in FIG. 6. Before an image is acquired, row select signal RS may be asserted at $t_1$. When signal RS is asserted, transistor 64 turns on and a corresponding output signal (pixel output) that is representative of the magnitude of the charge on charge storage node 50 is produced at node 82. The signal associated with the stored charge on node 50 is conveyed to row select transistor 64 by source-follower transistor 66. A vertical conductive path such as path 68 may be associated with each column of pixels. Path 68 may be coupled to current source 74. Current source 74 may sometimes be referred to as a pixel operating current.

When signal RS is asserted in a given row, path 68 can be used to route an output signal (pixel output) from that row to node 82. Reset control signal RST may also be asserted at $t_1$, as shown in FIG. 6. Asserting the reset control signal may turn on reset transistor 48 and may reset floating diffusion region 50 to $V_{rst}$. The reset control signal RST may then be deasserted to turn off reset transistor 48. After the reset process is complete, the charge level at floating diffusion node 50 may be sampled.

To sample the charge level while reducing power consumption, an in-column comparator may be used. To implement the in-column comparator, an additional transistor 102 may be interposed between node 82 and node 84. Transistor 102 may be a p-channel metal-oxide-semiconductor field-effect (pMOS) transistor. Transistor 102 may be a pMOS transistor if source follower transistor 66 is an nMOS transistor. In other words, transistor 102 and source follower transistor 66 may be transistors of the opposite type. If source follower transistor 66 is a pMOS transistor, then transistor 102 may be an nMOS transistor. Node 84 may be the in-column comparator output signal. Node 84 may be coupled to additional comparator stage 76. Transistor 102 is interposed between row select transistor 64 and current source 74. Transistor 102 is also interposed between row select transistor 64 and comparator 76.

To determine the pixel reset level, a searching voltage ($V_{search}$) may be applied to the gate of transistor 102. Similar to as discussed in connection to FIG. 3, the searching voltage may vary between known voltages. When the searching voltage is at a maximum level, the in-column comparator output signal may remain low. As $V_{search}$ is lowered, the searching voltage will reach a voltage that causes the transistor to be asserted. Once asserted, nodes 82 and 84 will be electrically connected and the in-column comparator output at node 84 will have the same voltage as the pixel output at node 82.

The in-column comparator output may be provided to a first input 78 of comparator 76. The second input 80 of comparator 76 may receive a reference voltage ($V_{ref\_cmpr}$) that remains constant. The reference voltage may be selected to be between an expected baseline of the in-column comparator output and the expected signal and reset levels of the in-column comparator output. The comparator may output a code decision indicating whether the in-column comparator output is as high as the reference voltage. When the in-column comparator output is lower than the reference voltage, the comparator's code decision may be at a logic low level "0". At some point, the in-column comparator output will increase above the pixel reset level. When the in-column comparator output is greater than the reference voltage, the comparator's code decision may be at a logic high level "1". Using this technique, the pixel reset level can therefore be determined. For example, if the code decision changes from low to high when the searching voltage changes from a first voltage to a second voltage, the pixel output signal may be between the first and second voltages.

FIG. 6 shows additional detail of the sampling process. As shown, at $t_2$ the pixel output (at node 82) is at the pixel reset level. However, the in-column comparator output (at node 84) is at a voltage below the pixel reset level. The searching voltage ($V_{search}$) applied to the gate of transistor 102 is lowered from a maximum value to a minimum value between $t_2$ and $t_4$. At $t_3$, the searching voltage may reach a value that electrically connects nodes 82 and 84. Therefore, the voltage at the in-column comparator output may increase to the pixel reset level (as shown in FIG. 6). Similarly, the increase in the in-column comparator output may cause the code decision to transition from low to high at $t_3$.

Next, after the reset charge level has been sampled, transfer gate control signal TX may be asserted at $t_5$ to turn on transfer transistor (transfer gate) 62. When transfer transistor 62 is turned on, the charge that has been generated by photodiode 42 in response to incoming light is transferred to charge storage node 50. Transfer gate control signal TX may be deasserted at $t_6$ after the transfer in charge is complete. As shown in FIG. 6, the pixel output signal may drop from the pixel reset level after the transfer transistor is asserted at $t_5$.

Once the charge has been transferred from photodiode 42 to floating diffusion node 50, the charge level at floating diffusion node 50 may be sampled. The searching voltage ($V_{search}$) applied to the gate of transistor 102 is lowered from a maximum value to a minimum value between $t_7$ and $t_9$. At $t_8$, the searching voltage may reach a value that electrically connects nodes 82 and 84. Therefore, the voltage at the in-column comparator output may increase to the pixel signal level at $t_8$ (as shown in FIG. 6). Similarly, the increase in the in-column comparator output may cause the code decision to transition from low to high at $t_8$.

FIG. 6 shows the searching voltage being varied using a ramp (step-by-step) voltage. This example is merely illustrative, and any desired searching algorithm may be used such as successive approximation, a combination of successive approximation and ramping, or multiple-ramping.

Because the in-column comparator uses current source 74 (instead of an additional power source), the power consumption of pixel 22 may be reduced. In FIG. 5, the in-column comparator stage formed by transistor 102 is coupled to an additional comparator stage. This example, however, is merely illustrative. If desired, the in-column comparator stage may be the only stage in the comparator or the in-column comparator stage may be coupled to two or more additional comparator stages.

Figure 7:
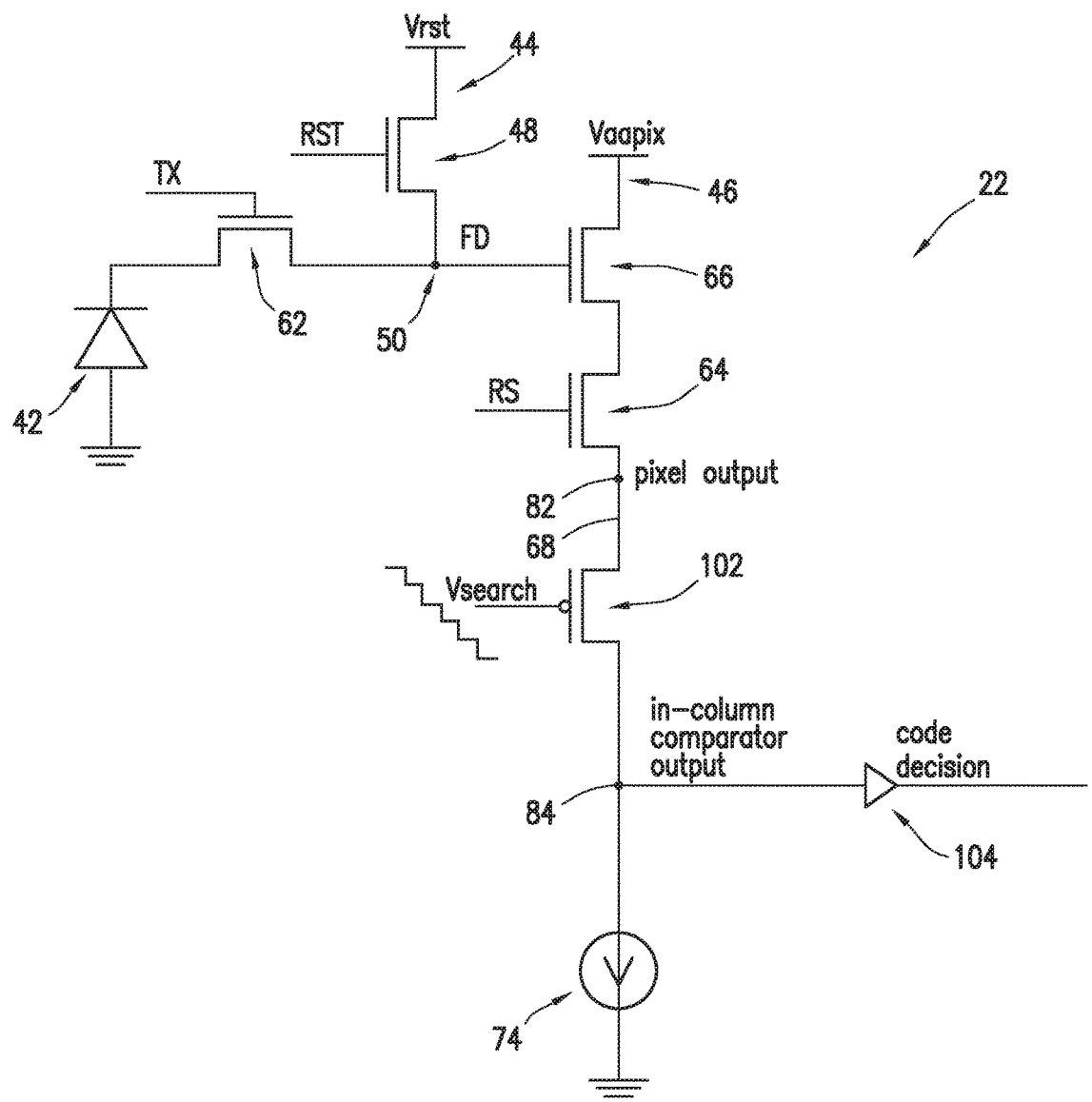
FIG. 7 is a circuit diagram of an illustrative image sensor pixel with an in-column comparator that is coupled to a digital buffer in accordance with an embodiment.

The circuitry shown in FIG. 5 is merely illustrative, and any desired circuitry may be used in a pixel with an in-column comparator stage. FIG. 7 shows an illustrative embodiment where instead of the in-column comparator output being coupled to a comparator (as shown in FIG. 5), the in-column comparator output is coupled to digital buffer 104. This embodiment may reduce power by removing comparator 76. The in-column comparator output may be buffered and used for an ADC code decision.

Figure 8:
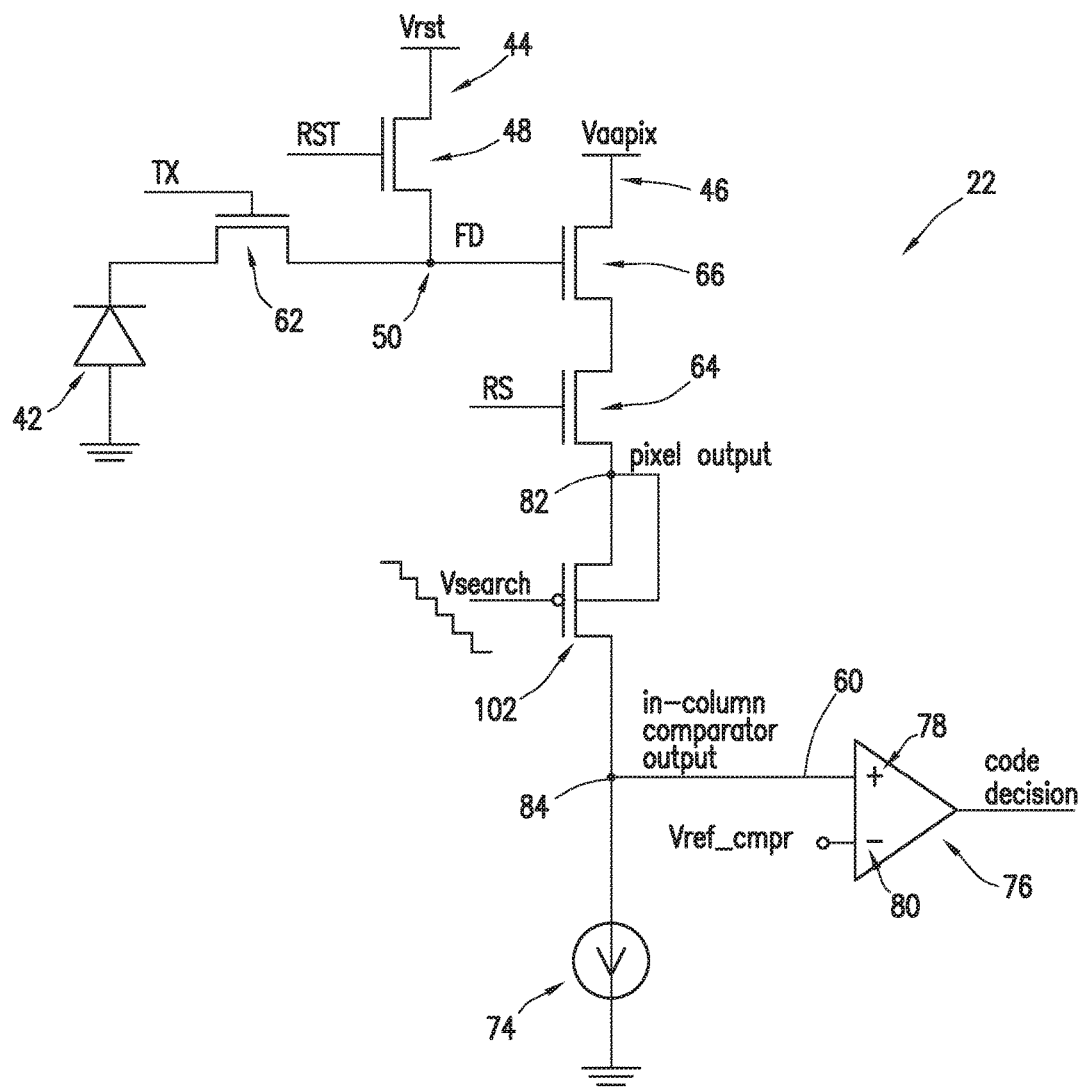
FIG. 8 is a circuit diagram of an illustrative image sensor pixel with the bulk of a transistor used to form an in-column comparator coupled to the source of the transistor in accordance with an embodiment.
Figure 9:
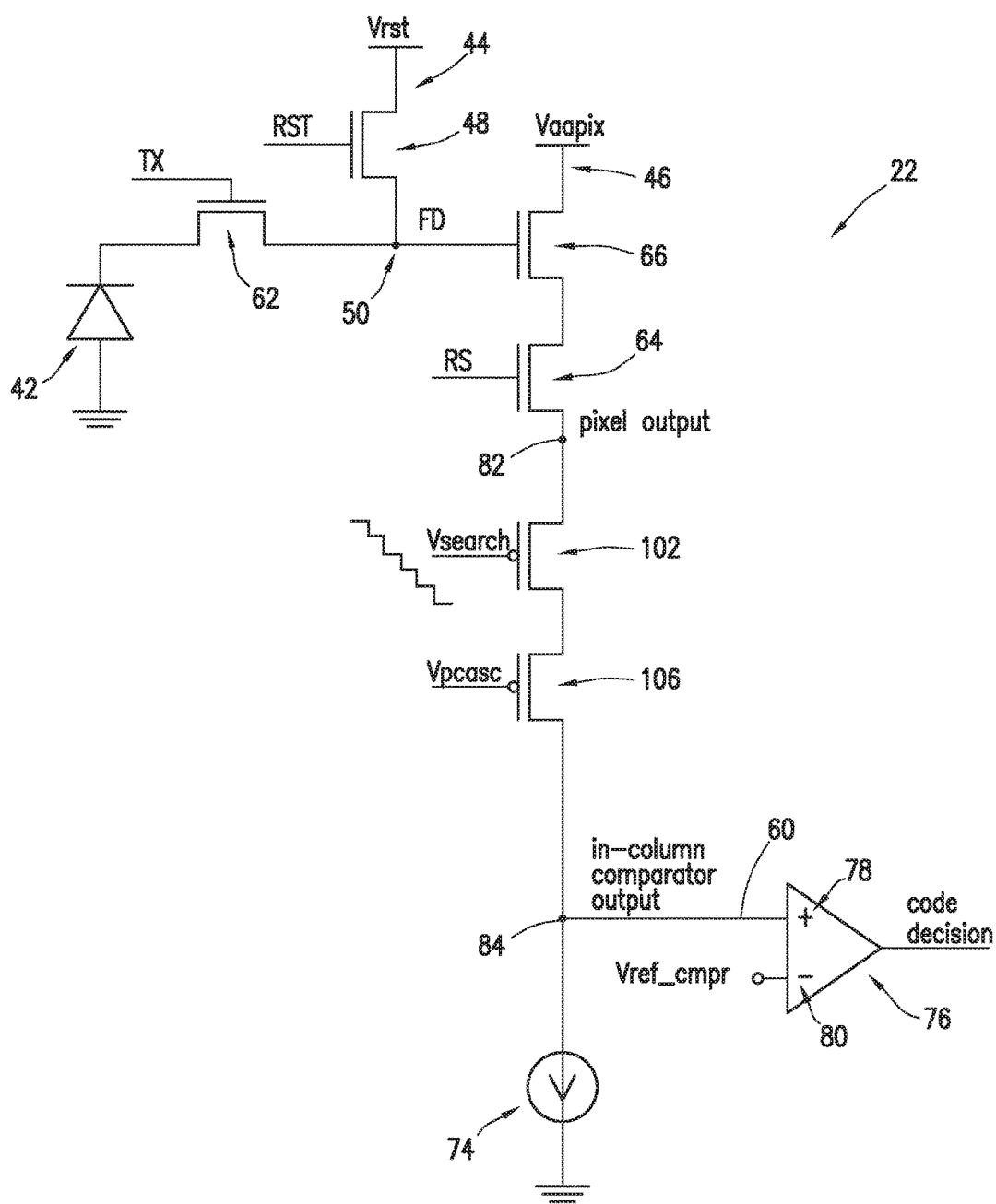
FIG. 9 is a circuit diagram of an illustrative image sensor pixel with a cascaded in-column comparator stage in accordance with an embodiment.

FIG. 8 shows another embodiment for the in-column comparator of pixel 22. As shown, the bulk of transistor 102 may be connected to its source (i.e., node 82) to improve the linearity of the response. In yet another embodiment, shown in FIG. 9, an additional transistor 106 may be interposed between transistor 102 and current source 74. The additional transistor may be interposed between transistor 102 and comparator 76. Transistor 106 may the same type of transistor as transistor 102 (i.e., if transistor 102 is a pMOS transistor than transistor 106 may also be a pMOS transistor). The transistor may receive a voltage ($V_{pcasc}$) at its gate and may form (with transistor 102) a cascaded in-column comparator stage. The cascaded stage may improve the overall direct current gain.

Figure 10:
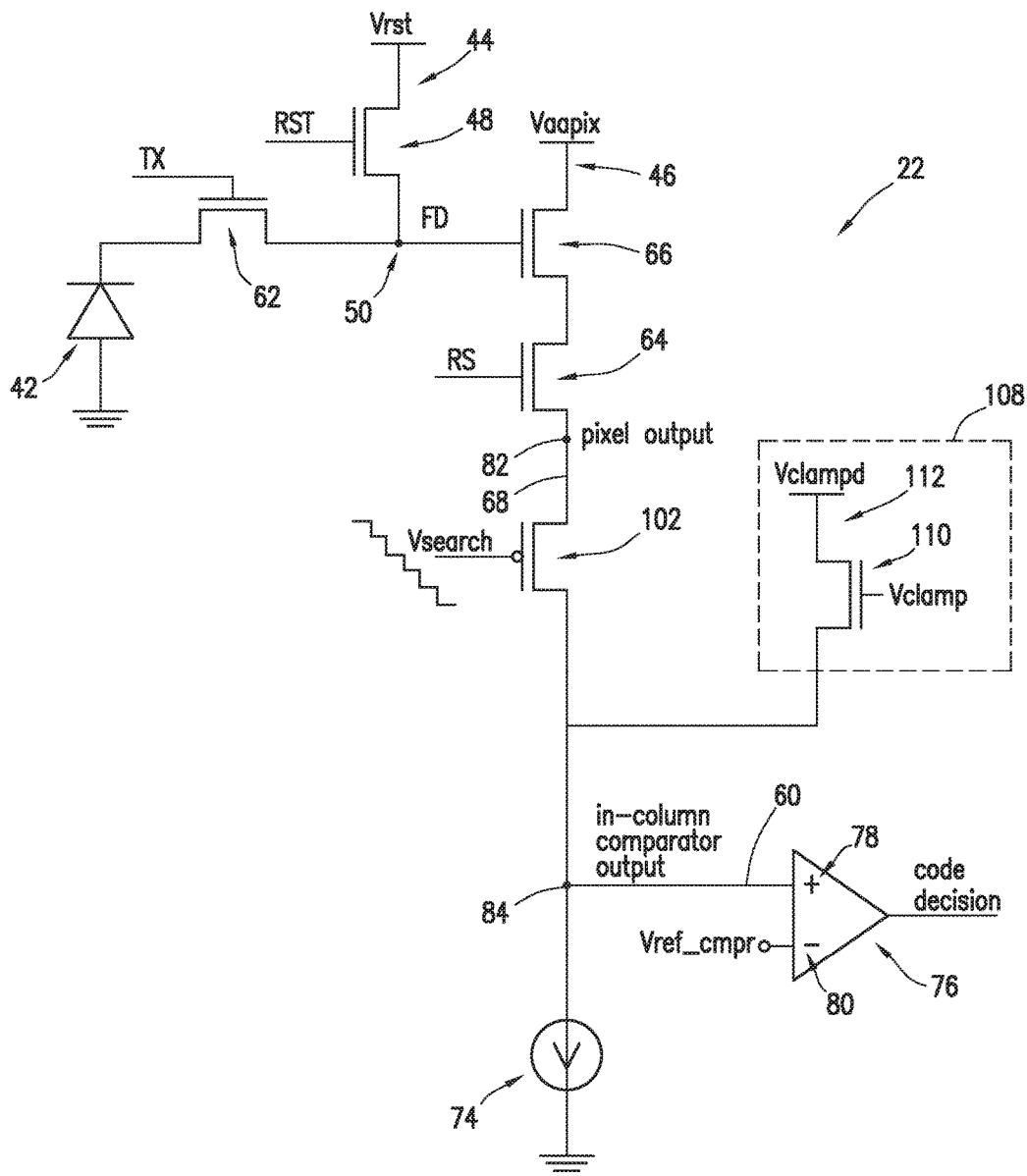
FIG. 10 is a circuit diagram of an illustrative image sensor pixel with an in-column comparator and a clamping circuit in accordance with an embodiment.

FIG. 10 shows yet another embodiment for a pixel 22 that includes an in-column comparator. As shown, a node 114 may be interposed between node 84 and transistor 102. Node 114 may be coupled to clamping circuit 108. The clamping circuit may prevent the output voltage (i.e., the in-column comparator output at node 84) from going too low or dropping to ground to avoid current source 74 from being shut down. In the example of FIG. 10, clamping circuit 108 is formed by a transistor 110 coupled to a voltage supply line 112. Transistor 110 may be the opposite type of transistor as transistor 102. For example, if transistor 102 is a pMOS transistor than transistor 110 may be an nMOS transistor. A voltage ($V_{clamp}$) may be supplied to the gate of transistor 110, and the transistor may be coupled between node 114 and a supply line 112 at $V_{clampd}$.

Figure 11:
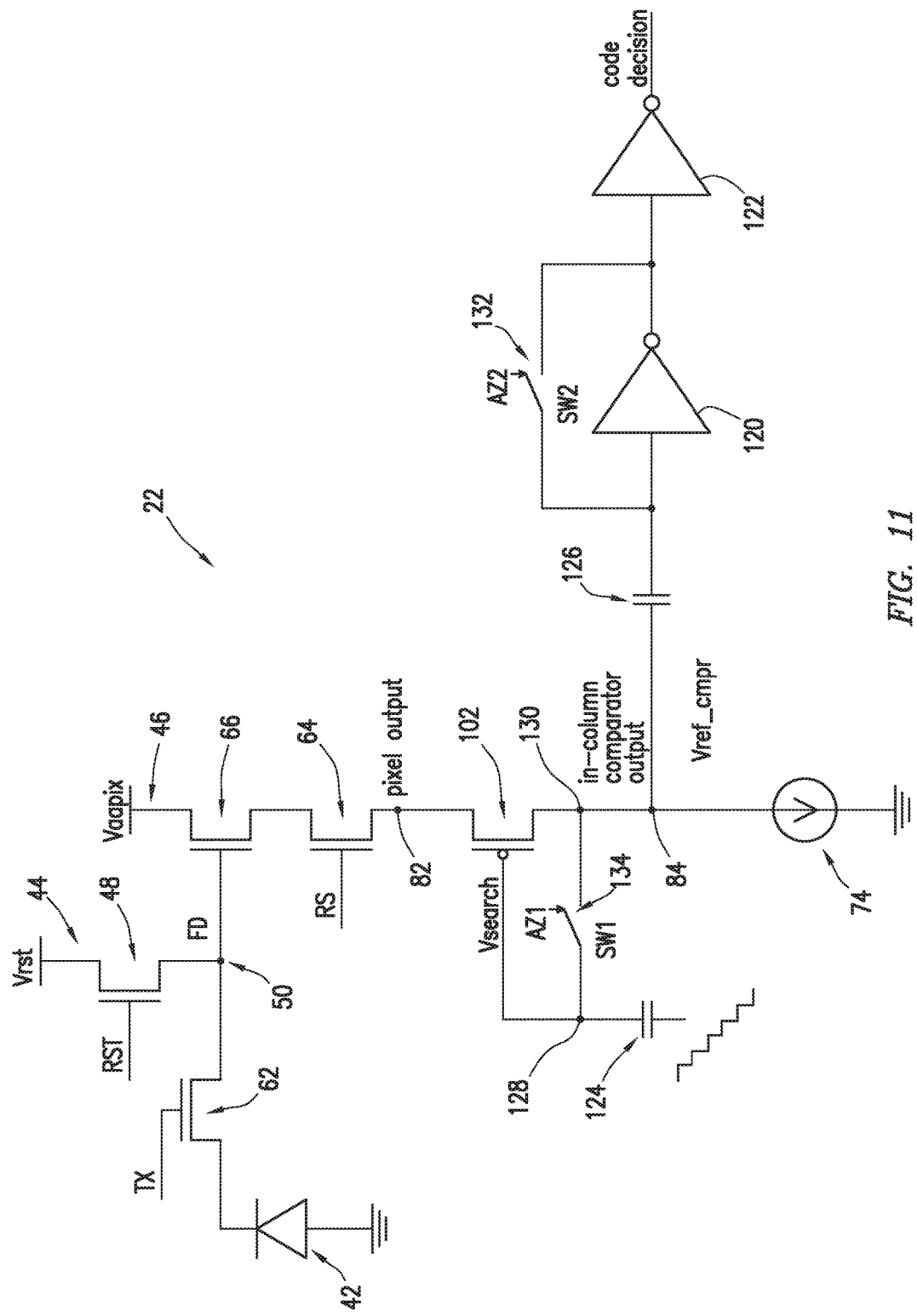
FIG. 11 is a circuit diagram of an illustrative image sensor pixel with an in-column comparator and switches in accordance with an embodiment.

FIG. 11 is another embodiment of an in-column comparator stage for an imaging pixel. The imaging pixel may include a first switch 134 (SW1) controlled by control signal AZ1. Switch 134 may be included to remove the offset voltage effect of the in-column comparator formed by transistor 102 and current source 74. The switch may be coupled between nodes 128 and 130. Node 128 may be coupled between capacitor 123 and the gate of transistor 102. Node 130 may be coupled between transistor 102 and node 84. The searching voltage ($V_{search}$) may be coupled to the gate of transistor 102 through capacitor 124. A second stage comparator may be formed by inverter 120, which is coupled to node 84 through capacitor 126. Inverter 120 may be biased at its sensitive transition region by turning on and then off the switch 132 (SW2) using control signal AZ2. Additional stages (i.e., inverter 122) may be cascaded after inverter 120 to increase the overall sensitivity of the comparator. Operation of pixel 22 in FIG. 11 may be similar to the operation of pixel 22 in FIG. 5. However, control signals AZ1 and AZ2 may be asserted at the same time as the reset signal. AZ1 and AZ2 may be asserted before the searching voltage starts ramping to determine charge level.

In various embodiments, an imaging pixel may include a photodiode, a current source, a source follower transistor that is coupled to the current source, a row select transistor that is interposed between the source follower transistor and the current source, and an additional transistor that is interposed between the row select transistor and the current source. The additional transistor may have a gate that receives a searching voltage. The searching voltage may be ramped from a maximum value to a minimum value.

The imaging pixel may also include a floating diffusion region that is coupled to the gate of the source follower transistor. The floating diffusion region may be coupled to a bias voltage supply line by a reset transistor. The imaging pixel may also include a transfer transistor that is configured to transfer charge from the photodiode to the floating diffusion region. The source follower transistor may be an nMOS transistor and the additional transistor may be a pMOS transistor. The source follower transistor may be a pMOS transistor and the additional transistor may be an nMOS transistor.

The additional transistor may form an in-column comparator stage that has an in-column comparator output. The imaging pixel may also include a comparator that has first and second inputs, the in-column comparator output may be supplied to the first input, and a reference voltage may be supplied to the second input. The imaging pixel may also include a digital buffer that receives the in-column comparator output. The imaging pixel may also include a clamping circuit that is coupled to a node that is interposed between the additional transistor and the in-column comparator output. The clamping circuit may include an nMOS transistor and the additional transistor may be a pMOS transistor. The additional transistor may have a bulk that is coupled to a node between the additional transistor and the row select transistor. The imaging pixel may also include a cascade transistor interposed between the additional transistor and the current source.

In various embodiments, an imaging pixel may include a photodiode, a floating diffusion region, a current source, a source follower transistor that is coupled to the current source and to the floating diffusion region, a row select transistor that is interposed between the source follower transistor and the current source, and an additional transistor that is interposed between the row select transistor and the current source. The source follower transistor may be a transistor of a first type. The additional transistor may be a transistor of a second type that is the opposite of the first type, and the additional transistor may serve as a first stage in a comparator used for readout.

The first type of transistor may be an nMOS transistor and the second type of transistor may be a pMOS transistor. An output from the first stage may be coupled to an input in an additional stage in the comparator. An output from the first stage may be coupled to a digital buffer.

In various embodiments, an imaging pixel may include a photodiode, a floating diffusion region, a current source, a source follower transistor that is coupled to the current source, a row select transistor that is interposed between the source follower transistor and the current source, and an additional transistor that is interposed between the row select transistor and the current source. The floating diffusion region may be coupled to a gate of the source follower transistor and the source follower transistor may be an nMOS transistor. The additional transistor may be a pMOS transistor, the additional transistor may serve as a first stage in a comparator used for readout, and the additional transistor may have a gate that receives a searching voltage. An output from the first stage may be coupled to an input in an additional stage in the comparator.

The foregoing is merely illustrative of the principles of this invention and various modifications can be made by those skilled in the art. The foregoing embodiments may be implemented individually or in any combination.

What is claimed is:

1. An imaging pixel comprising:
   a photodiode;
   a current source;
   a source follower transistor that is coupled to the current source;
   a row select transistor that is interposed between the source follower transistor and the current source; and
   an additional transistor that is interposed between the row select transistor and the current source, wherein the additional transistor has a gate that receives a searching voltage and wherein the searching voltage is ramped from a maximum value to a minimum value using a step-by-step algorithm.

2. The imaging pixel defined in claim 1, further comprising:
   a floating diffusion region, wherein the floating diffusion region is coupled to the gate of the source follower transistor and wherein the floating diffusion region is coupled to a bias voltage supply line by a reset transistor; and
   a transfer transistor that is configured to transfer charge from the photodiode to the floating diffusion region.

3. The imaging pixel defined in claim 1, wherein the source follower transistor is an nMOS transistor and the additional transistor is a pMOS transistor.

4. The imaging pixel defined in claim 1, wherein the source follower transistor is a pMOS transistor and the additional transistor is an nMOS transistor.

5. The imaging pixel defined in claim 1, wherein the additional transistor forms an in-column comparator stage that has an in-column comparator output.

6. The imaging pixel defined in claim 5, further comprising a comparator that has first and second inputs, wherein the in-column comparator output is supplied to the first input and a reference voltage is supplied to the second input.

7. The imaging pixel defined in claim 5, further comprising a digital buffer that receives the in-column comparator output.

8. The imaging pixel defined in claim 5, further comprising a clamping circuit, wherein the clamping circuit is coupled to a node that is interposed between the additional transistor and the in-column comparator output.

9. The imaging pixel defined in claim 8, wherein the clamping circuit comprises an nMOS transistor and wherein the additional transistor is a pMOS transistor.

10. The imaging pixel defined in claim 1, wherein the additional transistor has a bulk that is coupled to a node between the additional transistor and the row select transistor.

11. The imaging pixel defined in claim 1, further comprising a cascade transistor interposed between the additional transistor and the current source.

12. The imaging pixel defined in claim 1, wherein the additional transistor is coupled between a first node that is interposed directly between the row select transistor and the additional transistor and a second node that is interposed directly between the current source and the additional transistor.

13. An imaging pixel comprising:
   a photodiode;
   a floating diffusion region;
   a current source;
   a source follower transistor that is coupled to the current source and to the floating diffusion region, wherein the source follower transistor is a transistor of a first type;
   a row select transistor that is interposed between the source follower transistor and the current source; and
   an additional transistor that is interposed between the row select transistor and the current source, wherein the additional transistor is a transistor of a second type that is the opposite of the first type and wherein the additional transistor serves as a first stage in a comparator used for readout.

14. The imaging pixel defined in claim 13, wherein the first type of transistor is an nMOS transistor and wherein the second type of transistor is a pMOS transistor.

15. The imaging pixel defined in claim 13, wherein an output from the first stage is coupled to an input in an additional stage in the comparator.

16. The imaging pixel defined in claim 13, wherein an output from the first stage is coupled to a digital buffer.

17. An imaging pixel comprising:
   a photodiode;
   a floating diffusion region;
   a current source;
   a source follower transistor that is coupled to the current source, wherein the floating diffusion region is coupled to a gate of the source follower transistor and wherein the source follower transistor is an nMOS transistor;
   a row select transistor that is interposed between the source follower transistor and the current source; and
   an additional transistor that is interposed between the row select transistor and the current source, wherein the additional transistor is a pMOS transistor, wherein the additional transistor serves as a first stage in a comparator used for readout, and wherein the additional transistor has a gate that receives a searching voltage.

18. The imaging pixel defined in claim 17, wherein an output from the first stage is coupled to an input in an additional stage in the comparator.

19. An imaging pixel comprising:
   a photodiode;
   a current source;
   a source follower transistor that is coupled to the current source;
   a row select transistor that is interposed between the source follower transistor and the current source; and
   an additional transistor that is interposed between the row select transistor and the current source, wherein the additional transistor has a gate that receives a searching voltage, wherein the source follower transistor is a transistor of a first type, and wherein the additional transistor is a transistor of a second type that is the opposite of the first type.

* * * * *